United States Patent
Ohashi et al.

(10) Patent No.: US 9,531,577 B2
(45) Date of Patent: Dec. 27, 2016

(54) BIT-LIKELIHOOD CALCULATING APPARATUS AND BIT-LIKELIHOOD CALCULATING METHOD

(71) Applicant: Mitsubishi Electric Corporation, Tokyo (JP)

(72) Inventors: Akinori Ohashi, Tokyo (JP); Yasunori Noda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/437,938

(22) PCT Filed: Oct. 3, 2013

(86) PCT No.: PCT/JP2013/076964
§ 371 (c)(1),
(2) Date: Apr. 23, 2015

(87) PCT Pub. No.: WO2014/115376
PCT Pub. Date: Jul. 31, 2014

(65) Prior Publication Data
US 2015/0295748 A1    Oct. 15, 2015

(30) Foreign Application Priority Data
Jan. 25, 2013    (JP) ................................. 2013-012025

(51) Int. Cl.
*H04L 27/38* (2006.01)
*H03M 13/45* (2006.01)
(Continued)

(52) U.S. Cl.
CPC .......... *H04L 27/3854* (2013.01); *H03M 13/45* (2013.01); *H04L 25/067* (2013.01); *H03M 13/6325* (2013.01); *H03M 13/6331* (2013.01)

(58) Field of Classification Search
CPC ................................. H04L 27/38; H04L 25/06
(Continued)

(56) References Cited

U.S. PATENT DOCUMENTS 6,834,088 B2    12/2004    Agami et al.
2005/0135498 A1 *    6/2005    Yee ..................... H04L 1/0631
                                                                    375/267

(Continued)

FOREIGN PATENT DOCUMENTS

JP    4084059    4/2008
JP    2011 514780    5/2011

OTHER PUBLICATIONS

Miki, et al., "Recursive Maximum Likelihood Decoder for High-Speed Satellite Communication", IEEE, vol. 4, (1999), pp. 572-575.
(Continued)

*Primary Examiner* — Kevin M Burd
(74) *Attorney, Agent, or Firm* — Oblon, McClelland, Maier & Neustadt, L.L.P.

(57) ABSTRACT

A bit-likelihood calculating apparatus includes an initial-bit-likelihood calculating unit obtaining an inter-transmission-signal-point distance corresponding to N, a region number indicating a determination region of a transmission signal point nearest from data, and inter-nearest-point distance from a transmission signal point of initial bit=0 nearest to the data and a transmission signal point of initial bit=1 nearest to the data, and calculating likelihood of initial bit of the data serving as initial term of a recurrence formula for recursively calculating bit likelihood, an i-th-bit-likelihood calculating unit calculating, when N is 2 or larger, difference between inter-nearest-point distance with respect to (i−1)th bit and inter-nearest-point distance with respect to i-th bit and calculating likelihood of i-th bit of the data from likelihood of (i−1)th bit and the difference using the recurrence formula, and a processing-step control unit controlling calculation processing for bit likelihood based on N.

18 Claims, 6 Drawing Sheets

(51) Int. Cl.
  *H04L 25/06*   (2006.01)
  *H03M 13/00*   (2006.01)
(58) Field of Classification Search
  USPC .......................................... 375/341, 316, 340
  See application file for complete search history.

(56) References Cited

U.S. PATENT DOCUMENTS

| | | |
|---|---|---|
| 2009/0225878 A1 | 9/2009 | Papadopoulos et al. |
| 2012/0128085 A1* | 5/2012 | Seyama .............. H04L 25/0204 375/260 |

OTHER PUBLICATIONS

Volkhausen, et al., "Quantization Techniques for Accurate Soft Message Combining", IEEE, (2012), pp. 575-580.
Tosato, et al., "Simplified Soft-Output Demapper for Binary Interleaved COFDM with Application to HIPERLAN/2", IEEE ICC'02, vol. 2, (Apr.-May 2002), pp. 664-668.
International Search Report Issued Oct. 29, 2013 in PCT/JP13/076964 Filed Oct. 3, 2013.
Extended European Search Report issued in European Application No. 13872949.6 dated Aug. 9, 2016.
Zhang, M., et al., "Universal soft decision demodulator for M-ary adaptive modulation systems," 2012, *IEEE*, pp. 574-578.

* cited by examiner

FIG.3

| REGION NUMBER I | ASSIGNED BIT | $I-2^{(N/2-1)}$ | n0 | m0 | n1 | m1 | n2 | m2 | n3 | m3 |
|---|---|---|---|---|---|---|---|---|---|---|
| 0 | 0000 | -8 | -7 | -8 | -6 | -8 | -4 | -8 | 0 | -8 |
| 1 | 0001 | -7 | -7 | -8 | -6 | -7 | -4 | -7 | 0 | -7 |
| 2 | 0011 | -6 | -6 | -5 | -6 | -7 | -4 | -6 | 0 | -6 |
| 3 | 0010 | -5 | -6 | -5 | -5 | -7 | -4 | -5 | 0 | -5 |
| 4 | 0110 | -4 | -3 | -4 | -4 | -2 | -4 | -5 | 0 | -4 |
| 5 | 0111 | -3 | -3 | -4 | -3 | -2 | -3 | -5 | 0 | -3 |
| 6 | 0101 | -2 | -2 | -1 | -3 | -2 | -2 | -5 | 0 | -2 |
| 7 | 0100 | -1 | -2 | -1 | -3 | -1 | -1 | -5 | 0 | -1 |
| 8 | 1100 | 0 | 1 | 0 | 2 | 0 | 0 | 4 | 0 | -1 |
| 9 | 1101 | 1 | 1 | 0 | 2 | 1 | 1 | 4 | 1 | -1 |
| 10 | 1111 | 2 | 2 | 3 | 2 | 1 | 2 | 4 | 2 | -1 |
| 11 | 1110 | 3 | 2 | 3 | 3 | 1 | 3 | 4 | 3 | -1 |
| 12 | 1010 | 4 | 5 | 4 | 4 | 6 | 3 | 4 | 4 | -1 |
| 13 | 1011 | 5 | 5 | 4 | 5 | 6 | 3 | 5 | 5 | -1 |
| 14 | 1001 | 6 | 6 | 7 | 5 | 6 | 3 | 6 | 6 | -1 |
| 15 | 1000 | 7 | 6 | 7 | 5 | 7 | 3 | 7 | 7 | -1 |

FIG.4

| REGION NUMBER I | $d_0$ | $d_1$ | $d_2$ | $d_3$ |
|---|---|---|---|---|
| 0 | 1 | 2 | 4 | 8 |
| 1 | -1 | 1 | 3 | 7 |
| 2 | 1 | -1 | 2 | 6 |
| 3 | -1 | -2 | 1 | 5 |
| 4 | 1 | 2 | -1 | 4 |
| 5 | -1 | 1 | -2 | 3 |
| 6 | 1 | -1 | -3 | 2 |
| 7 | -1 | -2 | -4 | 1 |
| 8 | 1 | 2 | 4 | -1 |
| 9 | -1 | 1 | 3 | -2 |
| 10 | 1 | -1 | 2 | -3 |
| 11 | -1 | -2 | 1 | -4 |
| 12 | 1 | 2 | -1 | -5 |
| 13 | -1 | 1 | -2 | -6 |
| 14 | 1 | -1 | -3 | -7 |
| 15 | -1 | -2 | -4 | -8 |

FIG.5

| I[i] | I[i-1] | $\Delta_0(i=1)$ | $\Delta_1(i=2)$ | $\Delta_2(i=3)$ |
|---|---|---|---|---|
| 0 | 0 | 1 | 2 | 4 |
| 1 | 1 | -1 | -2 | -4 |
| 1 | 0 | -2 | -3 | -5 |
| 0 | 1 | 2 | 3 | 5 |

BIT-LIKELIHOOD CALCULATING APPARATUS AND BIT-LIKELIHOOD CALCULATING METHOD

FIELD

The present invention relates to a bit-likelihood calculating apparatus that calculates bitwise likelihood from data obtained by receiving a mapped modulation signal.

BACKGROUND

First, bitwise likelihood is explained. The bitwise likelihood means an index value representing, when attention is paid to a certain bit of transmission bits, the likelihood as to whether the certain bit is "0" or "1" on the reception side. In general, the bitwise likelihood is represented by a log-likelihood ratio (Formula (1)) shown below.

$$LLR(x_{i,j}) = \log\left\{\frac{P(x_{i,j} = 0 \mid y_k)}{P(x_{i,j} = 1 \mid y_k)}\right\} \quad (1)$$

In the formula, $x_{i,j}$ represents a j-th bit of a symbol $x_i$ transmitted by a transmission apparatus at time i and $y_k$ represents data received by a reception apparatus at time k, which is reception data corresponding to the symbol $x_i$ transmitted at the time i. $P(x_{i,j}=0|y_k)$ represents a conditional probability that $x_{i,j}$ is "0" when $y_k$ is received. $P(x_{i,j}=1|y_k)$ represents a conditional probability that $x_{i,j}$ is "1" when $y_k$ is received. From the above, it can be assumed that, if LLR $(x_{i,j})$ is larger than 0, $x_{i,j}$ is more likely to be "0" than "1" and, if LLR$(x_{i,j})$ is smaller than 0, $X_{i,j}$ is more likely to be "1" than "0". Further, the magnitude of LLR$(x_{i,j})$ represents the degree of the likelihood. The above Formula (1) can be represented by Formula (2) shown below when it is assumed that all transmitted bits occur with the same probability.

$$LLR(x_{i,j}) = \log\left\{\frac{\sum_{x_i:x_{i,j}=0} P(y_k \mid x_i)}{\sum_{x_i:x_{i,j}=1} P(y_k \mid x_i)}\right\} \quad (2)$$

The numerator (a condition is $x_i:x_{i,j}=0$) in a log on the right side of Formula (2) is the sum of the probabilities of receiving $y_k$ when the symbol $x_i$, the j-th bit of which is "0", is transmitted. The denominator (a condition is $x_i:x_{i,j}=1$) in a log on the right side of Formula (2) is the sum of the probabilities of receiving $y_k$ when the symbol $x_i$, the j-th bit of which is "1", is transmitted. It is assumed that the symbol $x_i$ is transmitted, subjected to fading, and received with Gaussian noise added thereto. If correction for the fading is perfectly performed and the reception data $y_k$ is extracted on the reception side, $P(y_k|x_i)$ can be approximated by Formula (3) shown below.

$$P(y_k \mid x_i) \cong \frac{1}{2\pi\sigma^2}\exp\left\{\frac{-(y_k - x_i)^2}{2\sigma^2}\right\} \quad (3)$$

In the formula, $\sigma_2$ represents the variance of the Gaussian noise and $(y_k-x_i)^2$ represents the Euclidian distance between the reception data $y_k$ and the transmission symbol $x_i$. That is, when the above Formula (3) is substituted into the formula of LLR$(x_{i,j})$, the above Formula (3) can be represented by Formula (4) for the Euclidian distance between the reception data $y_k$ and the transmission symbol $x_i$.

$$LLR(x_{i,j}) = \log \sum_{x_i:x_{i,j}=0} \exp\left\{\frac{-(y_k - x_i)^2}{2\sigma^2}\right\} - \log \sum_{x_i:x_{i,j}=1} \exp\left\{\frac{-(y_k - x_i)^2}{2\sigma^2}\right\} \quad (4)$$

In the above Formula (4), when the formula of LLR$(x_{i,j})$ is approximated using only the transmission symbol $x_i$ having a minimum distance among the Euclidian distances between the reception data $y_k$ and a plurality of the transmission symbols $x_i$, Formula (5) shown below is obtained.

$$LLR(x_{i,j}) = \min_{x_i:x_{i,j}=1}\{(y_k - x_i)^2\} - \min_{x_i:x_{i,j}=0}\{(y_k - x_i)^2\} \quad (5)$$

The above bitwise likelihood calculation formula is a commonly used method. As a specific likelihood calculation method, because the transmission symbol $x_i$ having a minimum Euclidian distance changes according to the reception data $y_k$, the transmission symbols $x_i$ are classified with respect to the values of the reception data $y_k$ and different likelihood calculation formulas are retained for the respective transmission symbols $x_i$ in advance. That is, a likelihood calculation is performed by selectively using from a plurality of the retained likelihood calculation formulas according to the values of the reception data $y_k$.

For example, Non Patent Literature 1 described below discloses a technology for reducing the computational complexity by further approximating a likelihood calculation with respect to the bitwise likelihood calculation explained above.

In the bitwise likelihood calculation explained above, it is necessary to individually retain the likelihood calculation formulas according to the values of the reception data $y_k$. When a likelihood calculation is actually implemented in a circuit, a memory for retaining the likelihood calculation formulas is necessary. Non Patent Literature 1 described below discloses a method of approximating and simplifying likelihood calculation formulas to become one likelihood calculation formula irrespective of the values of the reception data $y_k$. Consequently, it is possible to reduce the computational complexity and the amount of memory. Non Patent Literature 1 described below mentions that, when 16QAM (Quadrature Amplitude Modulation) and 64QAM are used as a modulation scheme and a convolutional code is used as an error correction code, then if the bit error rate obtained when the approximation of Non Patent Literature 1 is not performed and the bit error rate obtained when the approximation is performed are compared, deterioration in the bit error rate does not occur even if the approximation is performed.

CITATION LIST

Non Patent Literature

Non Patent Literature 1: Simplified Soft-Output Demapper for Binary Interleaved COFDM with Application to HIPERLAN/2, ICC'02, vol. 2, April-May 2002

SUMMARY

Technical Problem

However, according to the conventional technology, in the bitwise likelihood calculation, the computational complexity and the amount of memory are reduced by approximating and simplifying the likelihood calculation formulas to become one likelihood calculation formula irrespective of the values of the reception data $y_k$. However, there is a problem in that an error of the approximation due to the simplification increases as the number of multi-levels of a modulation scheme increases and, as a result, the performance deterioration increases. This is because the approximation of the likelihood calculation formula is a linear approximation corresponding to the reception data $y_k$, the likelihood calculation formula tends to deviate from a straight line when the number of multi-levels of the modulation scheme increases, and, therefore, the likelihood calculation error increases and, as a result, the performance deterioration increases.

The present invention has been devised in view of the above and it is an object of the present invention to obtain a bit-likelihood calculating apparatus that has fewer approximation errors and a simple likelihood calculation formula and is capable of reducing the computational complexity and the amount of memory even when a modulation scheme with the large number of multi-levels is used.

Solution to Problem

In order to solve the above problems and achieve the object, the present invention relates to a bit-likelihood calculating apparatus that performs a bit likelihood calculation on data obtained by receiving a modulation signal mapped by an N (N is an integer equal to or larger than 1) bit per symbol, the apparatus including: an initial-bit-likelihood calculating unit that obtains an inter-transmission-signal-point distance corresponding to a value of N, a region number indicating a determination region of a transmission signal point nearest from the data, and an inter-nearest-point distance, which is a shortest distance to a region where a hard decision value is inverted, from a transmission signal point of an initial bit=0 nearest to the data and a transmission signal point of an initial bit=1 nearest to the data, and calculates likelihood of an initial bit of the data serving as an initial term of a recurrence formula for recursively calculating bit likelihood; an i-th-bit-likelihood calculating unit that, when N is equal to or larger than 2, calculates a difference between an inter-nearest-point distance with respect to an (i−1)th bit ($2 \le i \le N$) and an inter-nearest-point distance with respect to an i-th bit, and calculates likelihood of the i-th bit of the data from likelihood of the (i−1)th bit and the difference using the recurrence formula; and a processing-step control unit that controls calculation processing for bit likelihood by the i-th-bit-likelihood calculating unit on a basis of the value of N.

Advantageous Effects of Invention

The bit-likelihood calculating apparatus according to the present invention has an effect that fewer approximation errors occur, a likelihood calculation formula is simple, and the computational complexity and the amount of memory can be reduced even when a modulation scheme with the large number of multi-levels is used.

BRIEF DESCRIPTION OF DRAWINGS

FIG. 3 is a diagram showing values of $n_i$ and $m_i$ with respect to region numbers when 256QAM is used.

FIG. 4 is a diagram of values of $d_i$ with respect to a region number 1.

FIG. 5 is a diagram of the relation between $d_i$ and $d_{i+1}$.

DESCRIPTION OF EMBODIMENTS

Exemplary embodiments of a bit-likelihood calculating apparatus according to the present invention are explained in detail below with reference to the drawings. Note that the present invention is not limited by the embodiments.

Embodiment

Figure 1:
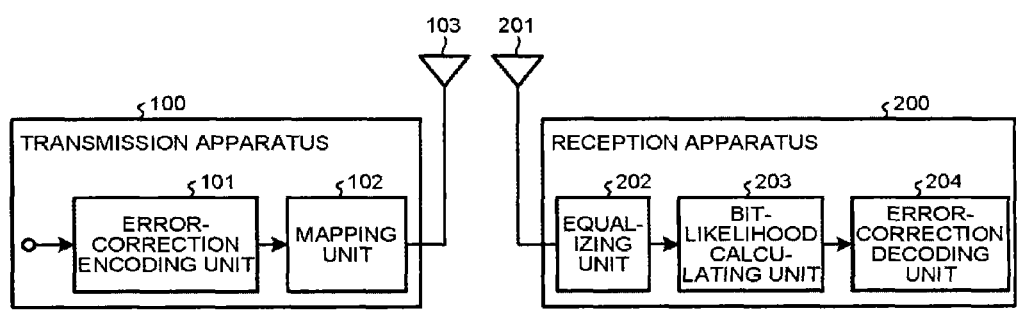
FIG. 1 is a diagram of an example of the configuration of a communication system in the present embodiment.

FIG. 1 is a diagram of an example of the configuration of a communication system in the present embodiment. The communication system is configured from a transmission apparatus 100 and a reception apparatus 200. In the present embodiment, a recurrence formula for a bit position is used for a likelihood calculation to carry out a bitwise likelihood calculation.

In the transmission apparatus 100, an error-correction encoding unit 101 is a circuit that performs error correction encoding processing on a bit sequence of transmission data. A mapping unit 102 is a circuit that performs symbol mapping processing on the bit sequence on which the error correction encoding processing is performed using a designated modulation scheme with the number of multi-levels N. A transmission antenna 103 transmits data subjected to the symbol mapping processing.

In the reception apparatus 200, an equalizing unit 202 is a circuit that performs equalization processing on data received by a reception antenna 201. A bit-likelihood calculating unit 203 is a circuit that calculates bitwise likelihood for the equalized data using a recurrence formula for a bit position. An error-correction decoding unit 204 is a circuit that performs error correction decoding processing using bitwise likelihood.

Specifically, the operation of the bit-likelihood calculating unit 203, which is a characteristic part of the present embodiment, is explained in detail. To facilitate the explanation, it is assumed that the modulation scheme is a quadrature amplitude modulation (QAM) and the number of multi-levels N is 8 bits. Note that the modulation scheme and the number of multi-levels N described above are examples and are not intended to be limitations.

The bit-likelihood calculating unit 203 performs a bitwise likelihood calculation using equalized data according to the recurrence formula for a bit position. Specifically, the recurrence formula used for a likelihood calculation by the bit-likelihood calculating unit 203 is explained. An I component of the reception data $y_k$ in the likelihood calculation formula shown in Formula (5) is represented as $r_I$ and a Q component of the reception data $y_k$ is represented as $r_Q$. In this case, when a bit sequence to be transmitted is symbol-mapped symmetrically with respect to the I axis and the Q axis, the I axis and the Q axis can be separately processed. Note that the reception data $y_k$ is equal to the equalized data after the equalization processing.

In the following explanation, to simplify the explanation, the explanation is limited to the I axis. However, likelihood can be calculated by the same method concerning the Q axis. A signal point, the i-th bit (when i=0, the LSB (Least Significant Bit)) of which is "1", nearest to $r_I$ is replaced by $(2n_i+1)A$ and a signal point, the i-th bit of which is "0", nearest to $r_I$ is replaced by $(2m_i+1)A$, likelihood can be represented as indicated by Formula (6) shown below.

$$LLR_i = (r_I - (2n_i+1)A)^2\} - (r_I - (2m_i+1)A)^2\} \quad (6)$$
$$= 4A(n_i - m_i)\{(n_i + m_i + 1)A - r_I\}$$

In the above Formula (6), $LLR_i$ represents an LLR of the i-th bit and A represents a half value of the inter-signal-point distance. In the above Formula (6), $n_i$ and $m_i$ represent values uniquely determined by determining a determination region of the reception data (the equalized data). The determination regions correspond to candidate points of a transmission symbol nearest to the equalized data. The region numbers are respectively assigned to the determination regions. As an example, determination regions of 256QAM and the region numbers of the respective determination regions are shown in FIG. 2.

Figure 2:
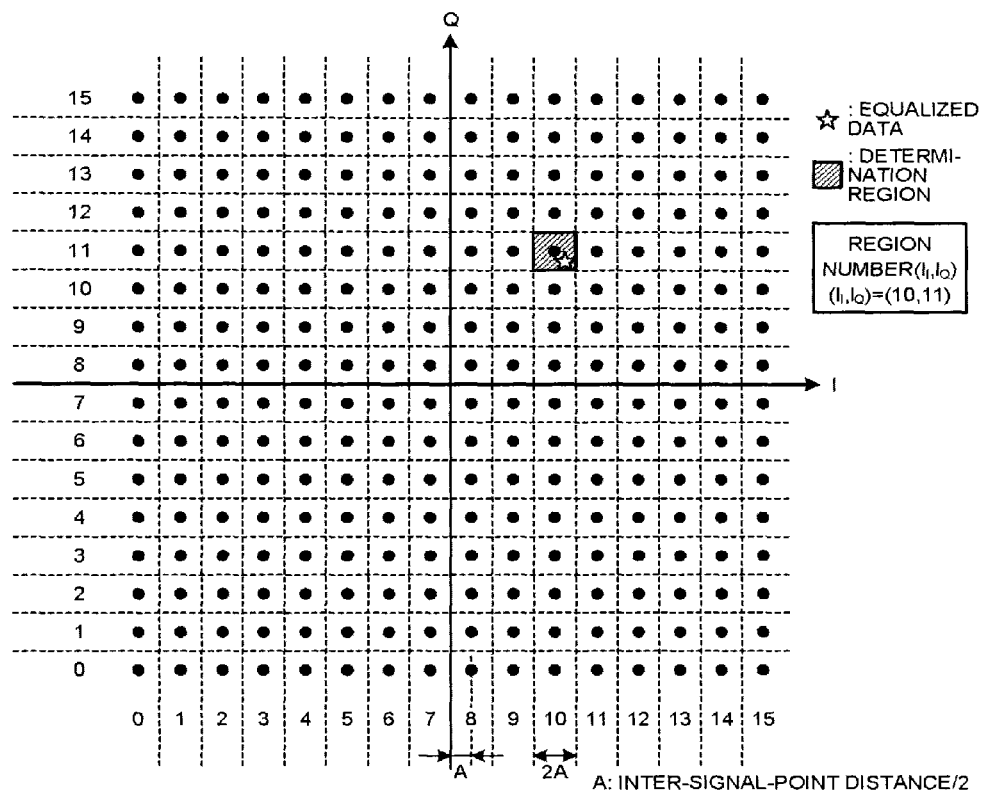
FIG. 2 is a diagram of the relation between determination regions and region numbers in a bit-likelihood calculating unit.
Figure 2:
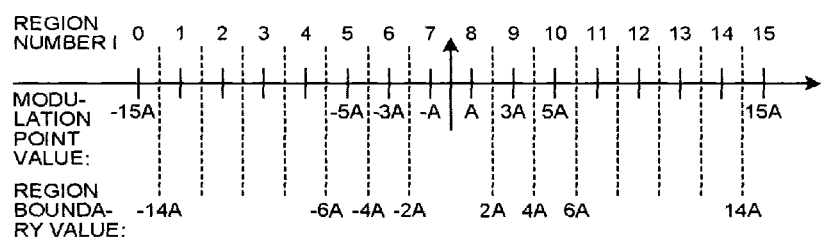

FIG. 2 is a diagram of the relation between the determination regions and the region numbers in the bit-likelihood calculating unit 203. The region number is represented by a region number $l_I$ on the I axis and a region number $l_Q$ on the Q axis. For both $l_I$ and $l_Q$, a region having the smallest values on the I axis and the Q axis has a region number "0" and the region number increases as the values on the I axis and the Q axis increase. When A represents a half of the inter-signal-point distance, the range of each region is 2A. When the center of a region is "0" in FIG. 2, signal point values take odd number values of A, 3A, 5A, . . . , and 15A in larger region numbers (8 to 15) and take odd number values of −15A, . . . , −5A, −3A, and −A in smaller region numbers (0 to 7), and signal boundary values take even number values of 2A, 4A, 6A, . . . , and 14A in larger region numbers (8 to 15) and take even number values of −14A, . . . , −6A, −4A, and −2A in smaller region numbers (0 to 7).

As an example, when the equalized data r=(5.5 A, 6.2 A), the equalized data r is at the position having the star mark in FIG. 2. From FIG. 2, because the equalized data is present in the determination region with the region number $l_I$=10 on the I axis and the region number $I_Q$=11 on the Q axis, the region numbers of the equalized data r=(5.5 A, 6.2 A) are $l_I$=10 and $l_Q$=11.

For each region number, $n_i$ and $m_i$ corresponding thereto are present. FIG. 3 is a diagram showing values of $n_i$ and $m_i$ corresponding to the region numbers when 256QAM is used. Assigned bits in FIG. 3 are Gray-coded and further mapped symmetrically with respect to both of the I axis and the Q axis. Therefore, the region number 1 in FIG. 3 corresponds to each of $l_I$ and $l_Q$. In FIG. 3, "$1-2^{(N/2-1)}$", is a value related to a signal point in the region number l. A signal point in the region number l can be represented by "$\{2(l-2^{(N/2-1)})+1\}A$".

In Formula (6), the difference between $n_i$ and $m_i$ is put as $d_i$. That is, any one of $n_i$ and $m_i$ is represented by "$l_I-2^{(N/2-1)}$" and the other is represented by "$l_I-2^{(N/2-1)}+d_i$". In Formula (6), $d_i$ represents the shortest distance to a region where the hard decision value of the i-th bit is inverted. When a coefficient 4A in Formula (6) is omitted for simplification and $d_i$ and "$l_I-2^{(N/2-1)}$" are used, Formula (6) can be represented as Formula (7) shown below.

$$LLR_i = (n_i - m_i)\{(n_i + m_i + 1)A - r_I\} \quad (7)$$
$$= s_i d_i\{2(l_I - 2^{(N/2-1)})A + d_i + A - r_I\}$$
$$= s_i d_i \beta_i$$

In Formula (7), "$\beta_i=\{2(l_I-2^{(N/2-1)})A+d_i+A-r_I\}$", $s_i$ represents a code that changes according to the value of the bit position i of the region number l represented in N/2 bit width. In Formula (7), $s_i$ takes any one of values "−1" and "1".

FIG. 4 is a diagram of values of $d_i$ with respect to the region number l. When the bitwise likelihood is calculated, usually, values of $d_0$ to $d_{(N/2-1)}$ are used. In the present embodiment, to obtain a recurrence formula for a bit position, the relation between $d_i$ and $d_i+1$ is obtained. When "$d_{i+1}=d_i+\Delta_i$" is put, $\Delta_i$ has the values shown in FIG. 5. FIG. 5 is a diagram of the relation between $d_i$ and $d_{i+1}$. From FIG. 5, $\Delta_i$ is uniquely determined by the value of l[i+1] with respect to the region number of the (i+1)th bit and the value of l[i] with respect to the region number of the i-th bit. From this value, a bit shift amount, an addition value, and a sign bit corresponding thereto are determined in order to calculate bitwise likelihood. $\Delta_i$ is any one of values $\pm(2^{i-1}+1)$ and $\pm(2^{i-1})$.

When the value obtained by removing a sign $s_i$ from Formula (7) is represented as $LLRS_i$, $LLRS_i$ can be represented by Formula (8) shown below.

$$LLRS_i = d_i\{2(l_I - 2^{(N/2-1)})A + d_i + A - r_I\} \quad (8)$$
$$= s_i(LLR_i)$$

When the relation "$d_{i+1}=d_i+\Delta_i$" is applied to Formula (8), the recurrence formula of Formula (9) shown below can be obtained.

$$LLRS_{i+1} = (d_i + \Delta_i)\{2(l_I - 2^{(N/2-1)})A + (d_i + \Delta_i)A + A - r_I\} \quad (9)$$
$$= (d_i + \Delta_i)(\beta_i + \Delta_i A)$$
$$= LLRS_i + \Delta_i\{d_i A + \beta_i + \Delta_i A\}$$

where $$LLRS_0 = d_0\{2(l_I - 2^{(N/2-1)})A + d_0 A + A - r_I\}$$
$$\beta_{i+1} = \beta_i + \Delta_i A$$

By using the recurrence formula of the above Formula (9), it is possible to calculate LLR in order starting from i=0.

Figure 6:
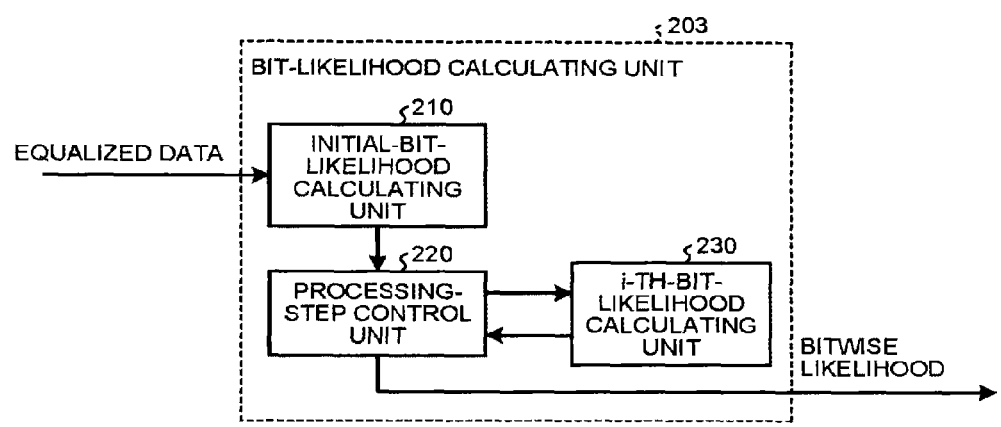
FIG. 6 is a diagram of an example of the configuration of the bit-likelihood calculating unit.

Subsequently, the configuration of the bit-likelihood calculating unit 203 that performs calculation of bit likelihood using the recurrence formula is explained in detail. FIG. 6 is a diagram of an example of the configuration of the bit-likelihood calculating unit 203. The bit-likelihood calculating unit 203 includes an initial-bit-likelihood calculating unit 210, a processing-step control unit 220, and an i-th-bit-likelihood calculating unit 230. The initial-bit-likelihood calculating unit 210 calculates $LLRS_0$. The i-th-bit-likelihood calculating unit 230 calculates $LLRS_i$ (i>0) using $LLRS_0$. The processing-step control unit 220 controls the operation of the i-th-bit-likelihood calculating unit 230 according to the number of multi-levels N. In the following explanation, details of each component are explained.

First, the initial-bit-likelihood calculating unit 210 is explained. The initial-bit-likelihood calculating unit 210 calculates the likelihood $LLRS_0$ of the initial bit using the equalized data. Specifically, the initial-bit-likelihood calculating unit 210 obtains, with respect to data obtained by receiving a modulation signal mapped by N (N is an integer equal to or larger than 1) bits per symbol, the inter-transmission-signal-point distance corresponding to the value of N, the region number indicating the determination region of the transmission signal point nearest from the data, and the inter-nearest-point distance, which is the shortest distance to a region where the hard decision value is inverted, from the transmission signal point of the initial bit=0 nearest to the data and the transmission signal point of the initial bit=1 nearest to the data, and calculates the likelihood of the initial bit of the data serving as the initial term of the recurrence formula for recursively calculating bit likelihood.

Figure 7:
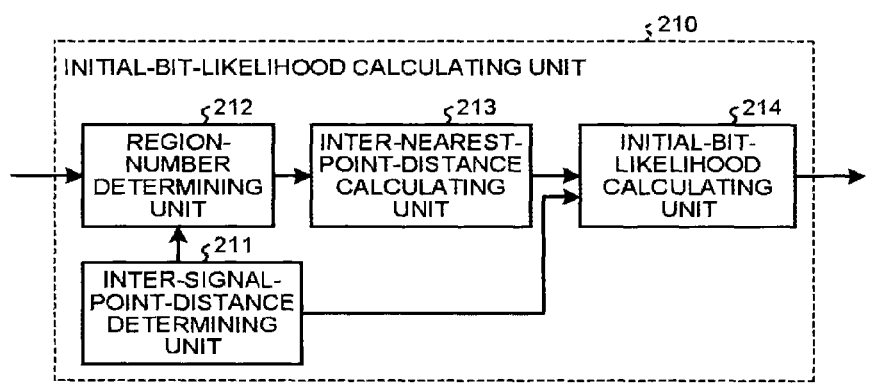
FIG. 7 is a diagram of an example of the configuration of an initial-bit-likelihood calculating unit.

FIG. 7 is a diagram of an example of the configuration of the initial-bit-likelihood calculating unit 210. The initial-bit-likelihood calculating unit 210 includes an inter-signal-point-distance determining unit 211, a region-number determining unit 212, an inter-nearest-point-distance calculating unit 213, and an initial-bit-likelihood calculating unit 214.

The inter-signal-point-distance determining unit 211 calculates A, which is a half value of the inter-signal-point distance of a transmission signal determined by the modulation scheme and the number of multi-levels N. For example, when the modulation scheme is QAM and the number of multi-levels N is 8 bits, that is, 256QAM is used on the transmission side, the inter-signal-point distance is $(1/\sqrt{(170)})$. The inter-signal-point distance corresponding to the number of multi-levels, i.e., N bits, when the modulation scheme is QAM can be calculated by Formula (10) shown below.

$$A = \frac{1}{\sqrt{2(2^N - 1)/3}} \quad (10)$$

In Formula (10), A represents a half value of the inter-signal-point distance. When circuit implementation is performed, the computational complexity can be reduced by retaining values of A in a table by a number corresponding to the number of multi-levels N without performing a square-root calculation.

The region-number determining unit 212 determines a determination region corresponding to the candidate point of a transmission symbol nearest to the equalized data input thereto and determines the region numbers $l_I$ and $l_Q$ indicating the determination region.

Figure 8:
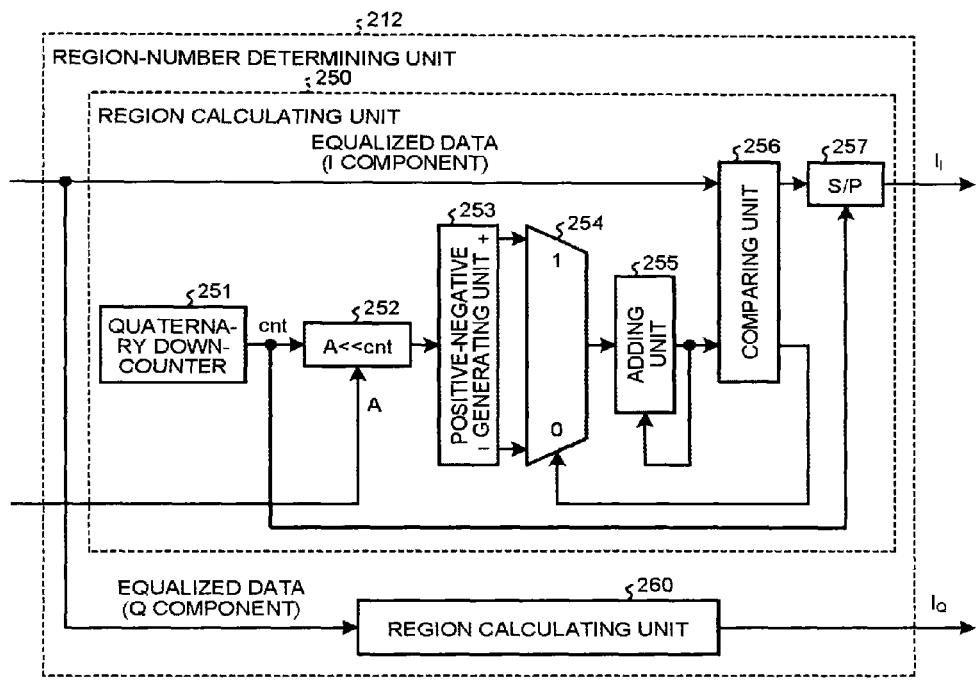
FIG. 8 is a diagram of an example of the configuration of a region-number determining unit.

In the following explanation, an example of the circuit configuration of the region-number determining unit 212 is explained in detail. FIG. 8 is a diagram of an example of the configuration of the region-number determining unit 212 corresponding to 256QAM. Note that the circuit configuration shown in FIG. 8 is an example and is not intended to be a limitation. The region-number determining unit 212 shown in FIG. 8 determines the region numbers $l_I$ and $l_Q$ from the I component $r_I$ and the Q component $r_Q$ of the equalized data. Region calculating units 250 and 260 calculate the region numbers $l_I$ and $l_Q$ using the bisection method. The region calculating units 250 and 260 have the same circuit configuration. In the following explanation, to simplify the explanation, the explanation is limited to the region number $l_I$. Note that the use of the bisection method in the region calculating units 250 and 260 is only an example. The region calculating units 250 and 260 can use other methods not using the bisection method such as a method of retaining a plurality of boundary values for determining a region number in a table in advance and comparing the boundary values and the I component $r_I$ and the Q component $r_Q$ of the equalized data to determine a region number.

The region calculating unit 250 includes a quaternary down-counter 251, a shift operation unit 252, a positive-negative generating unit 253, a selecting unit 254, an adding unit 255, a comparing unit 256, and an S/P 257. The region calculating unit 250 calculates $l_I$ with the bisection method processing in $(\log_2 N+1)$ steps with respect to the I component of the equalized data. In the case of 256QAM (N=8), processing in 4 (=$\log_2 8+1$) steps is performed. The quaternary down-counter 251 outputs a count value cnt at each step of the bisection method processing. The initial value of cnt is 3. In the following explanation, the operation of the region calculating unit 250 performed when $r_I$ is set to 5.5 A is explained.

At the first step of the bisection method processing, only the comparing unit 256 and the S/P 257 operate. The comparing unit 256 compares $r_I$ and a comparison target c and, when $r_I$>c, outputs "1" and otherwise outputs "0". Because c=0 at the first step, when $r_I$=5.5A, the comparing unit 256 outputs "1". The S/P 257 converts the output result of the comparing unit 256 input at each step from serial to parallel and outputs the output result at a point in time when all the steps of the bisection method processing are completed. When $r_I$=5.5A, "1" is input at the first step and is retained as "1".

At the second and subsequent steps, the comparison target c of the comparing unit 256 is calculated using the quaternary down-counter 251, the shift operation unit 252, the positive-negative generating unit 253, the selecting unit 254, and the adding unit 255. At the second step, the quaternary down-counter 251 outputs the initial value "3". The shift operation unit 252 outputs A<<3=8A. The positive-negative generating unit 253 outputs "8A" and "−8A". When the comparison result at the preceding step is "1", the selecting unit 254 selects positive "8A" and outputs "8A" to the adding unit 255. When the comparison result is "0", the selecting unit 254 selects negative "−8A" and outputs "−8A" to the adding unit 255. Because the comparison result at the preceding step (the first step) is "1", the selecting unit 254 outputs "8A". The adding unit 255 adds up the output value and the input value at the preceding step. At the second step, because there is no output value at the preceding step, the adding unit 255 adds up "0" and the input value "8A" and outputs c=8A. The comparing unit 256 compares $r_I$=5.5A and c=8A. Because $r_I$<c, the comparing unit 256 outputs "0". The S/P 257 shifts the retaining "1" to the left by one bit and adds the input value "0". The value retained at this point is "10 (binary notation)".

At the third step, the quaternary down-counter 251 outputs "2". The shift operation unit 252 outputs A<<2=4A. The positive-negative generating unit 253 outputs "4A" and "−4A". When the comparison result at the preceding step is "1", the selecting unit 254 selects positive "4A" and outputs "4A" to the adding unit 255. When the comparison result at the preceding step is "0", the selecting unit 254 selects negative "−4A" and outputs "−4A" to the adding unit 255. Because the comparison result at the preceding step (the second step) is "0", the selecting unit 254 outputs "−4A". The adding unit 255 adds up the output value and the input value at the preceding step. At the third step, the adding unit 255 adds up "8A", which is the output value at the preceding second step, and the input value "−4A" and outputs c=4A. The comparing unit 256 compares $r_I$=5.5A and c=4A. Because $r_I$>c, the comparing unit 256 outputs "1". The S/P 257 shifts the retaining "10" to the left by one bit and adds the input value "1". The value retained at this point is "101" (binary notation)".

At the fourth step, the quaternary down-counter 251 outputs "1". The shift operation unit 252 outputs A<<1=2A. The positive-negative generating unit 253 outputs "2A" and "−2A". When the comparison result at the preceding step is "1", the selecting unit 254 selects positive "2A" and outputs "2A" to the adding unit 255. When the comparison result at the preceding step is "0", the selecting unit 254 selects negative "−2A" and outputs "−2A" to the adding unit 255. Because the comparison result at the preceding step (the third step) is "1", the selecting unit 254 outputs "2A". The adding unit 255 adds up the output value and the input value at the preceding step. At the fourth step, the adding unit 255 adds up "4A", which is the output value at the preceding third step, and the input value "2A" and outputs c=6A. The comparing unit 256 compares $r_I$=5.5A and c=6A. Because $r_I$<c, the comparing unit 256 outputs "0". The S/P 257 shifts the retaining "101" to the left by one bit and adds the input value "0". The value retained at this point is "1010" (binary notation)".

Because the value retained by the S/P 257 is "1010 (binary notation)", the region calculating unit 250 outputs, as a region number, "$l_I$=10" obtained by converting "1010" into decimal notation.

The inter-nearest-point-distance calculating unit 213 calculates $d_0$. Specifically, the inter-nearest-point-distance calculating unit 213 calculates the inter-nearest-point distance from the transmission signal point of the initial bit=0 nearest to the equalized data and the transmission signal point of the initial bit=1 nearest to the equalized data. From FIG. 4, when the region number l is an even number, "$d_0$=−1", and, when the region number l is an odd number, "$d_0$=−1". Therefore, $d_0$ with respect to the region number l can be calculated by "$d_0$=1−2×l[0]".

The initial-bit-likelihood calculating unit 214 is a calculating unit for calculating the likelihood of the initial bit. The initial-bit-likelihood calculating unit 214 calculates the initial bit likelihood $LLRS_0$, $\beta_0$, and $d_0A$ using A, $l_I$, and $d_0$ calculated in the preceding stage, the equalized data $r_I$, and the number of multi-levels N.

The initial-bit-likelihood calculating unit 214 calculates the initial bit likelihood $LLRS_0$ using "$LLRS_0 = d_0\{2(l_I - 2^{(N/2-1)})A + d_0A + A - r_I\}$" in Formula (9). In this formula, $d_0$ is "1" or "−1". In the calculation of "$2(l_I - 2^{(N/2-1)})A$", $l_I$ is calculated for each bit at ($\log_2 N + 1$) steps by the bisection method. Therefore, by calculating "$(l_I - 2^{(N/2-1)})$" in units of bit and multiplying "$(l_I - 2^{(N/2-1)})$" by 2A, it is possible to calculate "$2(l_I - 2^{(N/2-1)})A$" without an unnecessary delay and only with a bit shift and addition without using a multiplier. Because "$LLRS_0 = d_0\beta_0 = d_0\{2(l_I - 2^{(N/2-1)})A + d_0A + A - r_I\}$", $\beta_0$ and $d_0A$ can be calculated in the calculation process of $LLRS_0$.

The processing-step control unit 220 is explained. The processing-step control unit 220 controls calculation processing for calculating the bit likelihood by the i-th-bit-likelihood calculating unit 230. The processing-step control unit 220 increments a count value sent at a processing step of likelihood calculation every time the processing by the i-th-bit-likelihood calculating unit 230 is carried out. Specifically, the initial value of sent is set to "0". When scnt<N/2 is satisfied, the processing-step control unit 220 carries out the processing by the i-th-bit-likelihood calculating unit 230 once to increment sent and repeatedly operates until scnt<N/2 is not satisfied anymore. When scnt<N/2 is not satisfied, the processing-step control unit 220 omits the processing by the i-th-bit-likelihood calculating unit 230 and outputs the calculated bitwise likelihood to the error-correction decoding unit 204.

The i-th-bit-likelihood calculating unit 230 is explained. The i-th-bit-likelihood calculating unit 230 calculates $LLRS_i$ and $LLR_i$ with respect to i=scnt. Specifically, when N is equal to or larger than 2, the i-th-bit-likelihood calculating unit 230 calculates the difference between the inter-nearest-point distance with respect to the (i−1)th bit and the inter-nearest-point distance with respect to the i-th bit and calculates the likelihood of the i-th bit of data from the likelihood of the (i−1)th bit and the difference by using a recurrence formula.

Figure 9:
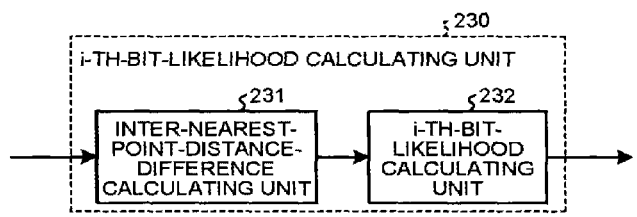
FIG. 9 is a diagram of an example of the configuration of an i-th-bit-likelihood calculating unit.

FIG. 9 is a diagram of an example of the configuration of the i-th-bit-likelihood calculating unit 230. The i-th-bit-likelihood calculating unit 230 includes an inter-nearest-point-distance-difference calculating unit 231 and an i-th-bit-likelihood calculating unit 232.

The inter-nearest-point-distance-difference calculating unit 231 calculates the difference between the inter-nearest-point distance with respect to the i−1)th bit and the inter-nearest-point distance with respect to the i-th bit. Specifically, the inter-nearest-point-distance-difference calculating unit 231 calculates $\Delta_{i-1}$ only when i>0. $\Delta_{i-1}$ can be calculated according to FIG. 5. When calculating the difference in the likelihood calculation for the i-th bit, the inter-nearest-point-distance-difference calculating unit 231 determines, from the values with respect to the region numbers of the i-th bit and the (i−1)th bit, a bit shift amount, an addition value, and a sign bit corresponding to the values and calculates the difference in the inter-nearest-point distance during the likelihood calculation for the i-th bit.

The i-th-bit-likelihood calculating unit 232 is a calculating unit for calculating the likelihood of the i-th bit. The i-th-bit-likelihood calculating unit 232 calculates $LLRS_1$ and $LLR_i$ with respect to i=scnt. The i-th-bit-likelihood calculating unit 232 calculates the likelihood of the i-th bit of the equalized data from the likelihood of the (i−1)th bit and the difference in the inter-nearest-point distance calculated in the inter-nearest-point-distance-difference calculating unit 231 using a recurrence formula. When i=0, the i-th-bit-likelihood calculating unit 232 calculates only $LLR_0$ using $LLRS_0$ calculated by the initial-bit-likelihood calculating unit 210. When i=1, the i-th-bit-likelihood calculating unit 232 calculates $\Delta_{i-1}A$ using $\Delta_{i-1}$ calculated by the inter-nearest-point-distance-difference calculating unit 231 and calculates $LLRS_i$ and $LLR_i$. When i>1, the i-th-bit-likelihood calculating unit 232 calculates $\beta_{i-1}$, $d_{i-1}A$, and $\Delta_{i-1}A$ and calculates $LLRS_i$ and $LLR_i$.

The i-th-bit-likelihood calculating unit 232 calculates $\Delta_{i-1}A$ only when i>0. Because $\Delta_{i-1}$ is either $\pm(2^{i-1}+1)$ or $\pm(2^{i-1})$, the i-th-bit-likelihood calculating unit 232 calculates $\Delta_{i-1}A$ only with a bit shift and addition without using a multiplier. $\beta_{i-1}$ and $d_{i-1}A$ can be calculated by Formula (11) and Formula (12) shown below only when i>1.

$$\beta_{i-1} = \beta_0 + \sum_{k=1}^{i-2} \Delta_k A \quad (11)$$

$$d_{i-1}A = d_0 A + \sum_{k=1}^{i-2} \Delta_k A \quad (12)$$

In the formulas, for $\Delta_k A$, the value of $\Delta_{i-1}A$ calculated earlier is used. When i=1, $\beta_0$ and $d_0 A$ calculated by the initial-bit-likelihood calculating unit. 214 are used as they are.

The i-th-bit-likelihood calculating unit 232 calculates $LLRS_i$ only when i>0. From Formula (9), $LLRS_i$ is calculated by "$LLRS_i = LLRS_{i-1} + \Delta_{i-1}\{d_i - 1A + \beta_{i-1} + \Delta_{i-1}/A\}$". The i-th-bit-likelihood calculating unit 232 calculates the multiplication of $\Delta_{i-1}$ only with a bit shift and addition without using a multiplier.

The i-th-bit-likelihood calculating unit 232 calculates $LLR_i$ with respect to all the values of i. The i-th-bit-likelihood calculating unit 232 calculates $LLR_i$ by inverting a code according to the i-th bit $l_I[i]$ and the (i+1)th bit $l_I[i+1]$ of the region number. When $\Delta_i$ in FIG. 5 created on the basis of $d_i$ in FIG. 4 is used, $LLR_i$ is calculated by "$LLR_i = \{1 - 2 \times ((l_I[i]) XOR(l_1[i+1]))\} \times LLRS_i$". XOR represents an exclusive OR and $l_I[N/2]$ is "0".

In this way, when N is equal to or larger than 2, the i-th-bit-likelihood calculating unit 230 calculates the likelihood of a second bit of data from the difference calculated from the inter-nearest-point distance with respect to the initial bit and the inter-nearest-point distance with respect to the second bit and the likelihood of the initial bit. Thereafter, according to control by the processing-step control unit 220, the i-th-bit-F, likelihood calculating unit 230 calculates the likelihood of the i-th bit of the data from the difference calculated from the inter-nearest-point distance with respect to the (i−1)th bit and the inter-nearest-point distance with respect to the i-th bit and the likelihood of the (i−1)th bit, thereby recursively calculating the likelihood up to the N-th bit of the data.

Note that, when there are a plurality of values that N can take, the i-th-bit-likelihood calculating unit 230 recursively executes, N−1 times, processing for calculating the likelihood on the basis of the value of N according to the control by the processing-step control unit 220.

When N is 1, the likelihood of the initial bit of the data, which is the first term of the recurrence formula, calculated by the initial-bit-likelihood calculating unit 210 directly becomes the bitwise likelihood of the data.

As explained above, according to the present embodiment, the bit-likelihood calculating apparatus recursively calculates the likelihood of a bit by calculating the difference in likelihood between bits using a recurrence formula for likelihood calculation. In the recurrence formula for the likelihood calculation, the computational complexity is suppressed and the likelihood calculation is realized only with a bit shift and addition without using a multiplier. Consequently, because the amount of memory can be reduced, it is possible to facilitate circuit implementation. It is possible to calculate the bitwise likelihood with fewer approximation errors and less computational complexity than in the conventional likelihood calculation performed using Formula (5).

In the present embodiment, the explanation is limited to 256QAM (N=8) to simplify the explanation. However, the bit-likelihood calculating apparatus can cope with the larger number of multi-levels with the same circuit configuration by including, without being limited to the table of Formula (10), the table of $\Delta_i$ (1=0, 1, . . . , and N/2−1) in FIG. 5, and N−8, a table adjusted to the magnitude of the value of N that the bit-likelihood calculating apparatus desires to cope with. Therefore, it is possible to reduce the computational complexity and the amount of memory to be less than in the past. It is possible to prevent a situation in which an error increases as the number of multi-levels of a modulation scheme increases and, as a result, the performance deterioration increases.

When there are a plurality of values of N that the bit-likelihood calculating apparatus desires to cope with, the bit likelihood calculating apparatus can also cope with the values of N with the same circuit configuration by including the table of Formula (10) and the table of $\Delta_i$ (i=0, 1, . . . , and N/2−1) in FIG. 5 by a number equivalent to the values of N that the bit-likelihood calculating apparatus desires to cope with.

INDUSTRIAL APPLICABILITY

As explained above, the bit-likelihood calculating apparatus according to the present invention is useful for a reception apparatus and, in particular, suitable for receiving a mapped modulation signal.

REFERENCE SIGNS LIST

100 transmission apparatus, 101 error-correction encoding unit, 102 mapping unit, 103 transmission antenna, 200 reception apparatus, 201 reception antenna, 202 equalizing unit, 203 bit-likelihood calculating unit, 204 error-correction decoding unit, 210 initial-bit-likelihood calculating unit, 211 inter-signal-point-distance determining unit, 212 region-number determining unit, 213 inter-nearest-point-distance calculating unit, 214 initial-bit-likelihood calculating unit, 220 processing-step control unit, 230 i-th-bit-likelihood calculating unit, 231 inter-nearest-point-distance-difference calculating unit, 232 i-th-bit-likelihood calculating unit, 250, 260 region calculating unit, 251 quaternary down-counter, 252 shift calculating unit, 253 positive-negative generating unit, 254 selecting unit, 255 adding unit, 256 comparing unit, 257 S/P.

The invention claimed is:

1. A bit-likelihood calculating apparatus that performs a bit likelihood calculation on data obtained by receiving a modulation signal mapped by an N (N is an integer equal to or larger than 1) bit per symbol, the apparatus comprising:

an initial-bit-likelihood calculating and memory unit including at least one circuit that obtains an inter-transmission-signal-point distance corresponding to a value of N, a region number indicating a determination region of a transmission signal point nearest from the data, and an inter-nearest-point distance, which is a shortest distance to a region where a hard decision value is inverted, from a transmission signal point of an initial bit=0 nearest to the data and a transmission signal point of an initial bit=1 nearest to the data, and calculates likelihood of an initial bit of the data serving as an initial term of a recurrence formula for recursively calculating bit likelihood;

an i-th-bit-likelihood calculating and memory unit including said at least one circuit that, when N is equal to or larger than 2, calculates a difference between an inter-nearest-point distance with respect to an (i−1)th bit (2≤i≤N) and an inter-nearest-point distance with respect to an i-th bit, and calculates likelihood of the i-th bit of the data from likelihood of the (i−1)th bit and the difference using the recurrence formula; and a processing-step control and memory unit including said at least one circuit that controls calculation processing for bit likelihood by the i-th-bit-likelihood calculating unit on a basis of the value of N.

2. The bit-likelihood calculating apparatus according to claim 1, wherein, when N is equal to or larger than 2, the initial-bit-likelihood calculating unit calculates likelihood of the initial bit of the data serving as the first term of the recurrence formula, and the i-th-bit-likelihood calculating unit calculates likelihood of a second bit of the data from a difference calculated from an inter-nearest-point distance with respect to the initial bit and an inter-nearest-point distance with respect to the second bit and the likelihood of the initial bit, and thereafter, calculates likelihood up to an N-th bit of the data according to control by the processing-step control unit.

3. The bit-likelihood calculating apparatus according to claim 1, wherein, when there are a plurality of values that N is allowed to take, the i-th-bit-likelihood calculating unit recursively executes, N−1 times, processing for calculating likelihood on a basis of the value of N according to control by the processing-step control unit.

4. The bit-likelihood calculating apparatus according to claim 1, wherein, when N is 1, the initial-bit-likelihood calculating unit calculates likelihood of the initial bit of the data serving as the first term of the recurrence formula and sets the likelihood of the initial bit as bitwise likelihood of the data.

5. The bit-likelihood calculating apparatus according to claim 1, wherein the initial-bit-likelihood calculating unit includes:

an inter-signal-point distance determining unit that calculates an inter-transmission-signal-point distance corresponding to the value of N;

a region-number determining unit that determines a determination region of a transmission signal point nearest from the data and calculates a region number indicating the determination region;

an inter-nearest-point-distance calculating unit that calculates the inter-nearest-point distance from a transmission signal point of an initial bit=0 nearest to the data and a transmission signal point of an initial bit=1 nearest to the data; and an initial-bit-likelihood calculating unit that calculates likelihood of the initial bit using the inter-transmission-signal-point distance, the region number, and the inter-nearest-point distance.

6. The bit-likelihood calculating apparatus according to claim 5, wherein the region-number determining unit determines a region number using a bisection method.

7. The bit-likelihood calculating apparatus according to claim 5, wherein the inter-nearest-point-distance calculating unit selects −1 or 1 from a value of a least significant bit (LSB) of the region number and sets a selection result as an inter-nearest-point distance of the initial bit.

8. The bit-likelihood calculating apparatus according to claim 1, wherein the i-th-bit-likelihood calculating unit includes:

an inter-nearest-point-distance-difference calculating unit that calculates a difference between an inter-nearest-point distance with respect to the (i−1)th bit and an inter-nearest-point distance with respect to the i-th bit; and an i-th-bit-likelihood calculating unit that calculates likelihood of the i-th bit of the data from likelihood of the (i−1)th bit and the difference using the recurrence formula.

9. The bit-likelihood calculating apparatus according to claim 8, wherein, when calculating a difference in likelihood calculation for the i-th bit, the inter-nearest-point-distance-difference calculating unit determines, from values with respect to region numbers of the i-th-bit and the (i−1)th bit, a shift amount, an addition value, and a sign bit corresponding to the values and calculates the difference in inter-nearest-point distance during the likelihood calculation for the i-th bit.

10. A bit-likelihood calculating method for data obtained by receiving a modulation signal mapped by an N (N is an integer equal to or larger than 1) bit per symbol, the method comprising:

calculating and storing in memory likelihood of an initial bit of the data serving as an initial term of a recurrence formula for recursively calculating bit likelihood by obtaining an inter-transmission-signal-point distance corresponding to a value of N, a region number indicating a determination region of a transmission signal point nearest from the data, and an inter-nearest-point distance, which is a shortest distance to a region where a hard decision value is inverted, from a transmission signal point of an initial bit=0 nearest to the data and a transmission signal point of an initial bit=1 nearest to the data;

calculating and storing in the memory a difference between an inter-nearest-point distance with respect to an (i−1)th bit (2≤i≤N) and an inter-nearest-point distance with respect to an i-th bit, and calculating and storing in the memory likelihood of the i-th bit of the data from likelihood of the (i−1)th bit and the difference using the recurrence formula, when N is equal to or larger than 2; and controlling calculation processing for bit likelihood at the calculating likelihood of the i-th bit on a basis of the value of N.

11. The bit-likelihood calculating method according to claim 10, wherein, when N is equal to or larger than 2, the calculating likelihood of the initial bit includes calculating likelihood of the initial bit of the data serving as the first term of the recurrence formula, and the calculating likelihood of the i-th bit includes recursively calculating likelihood up to an N-th bit of the data by calculatina likelihood of a second bit of the data from a difference calculated from an inter-nearest-point distance with respect to the initial bit and an inter-nearest-point distance with respect to the second bit and the likelihood of the initial bit, and thereafter, calculating likelihood of the i-th bit of the data from a difference calculated from an inter-nearest-point distance with respect to the (i−1)th bit and an inter-nearest-point distance with to respect to the i-th bit and the likelihood of the (i−1)th bit.

12. The bit-likelihood calculating method according to claim 10, wherein, when there are a plurality of values that N is allowed to take, the calculating likelihood of the i-th bit includes recursively executing, N−1 times, processing for calculating likelihood on a basis of the value of N.

13. The bit-likelihood calculating method according to claim 10, wherein, when N is 1, the calculating likelihood of the initial bit includes calculating likelihood of the initial bit of the data serving as the first term of the recurrence formula and setting the likelihood of the initial bit as bitwise likelihood of the data.

14. The bit-likelihood calculating method according to claim 10, wherein
the calculating likelihood. of the initial bit further includes:
calculating an inter-transmission-signal-point distance corresponding to the value of N;
determining a determination region of a transmission sianal point nearest from the data and obtaining a region number including the determination region;
calculating the inter-nearest-point distance from a transmission signal point of an initial bit=0 nearest to the data and a transmission signal point of an initial bit =1 nearest to the data; and
calculating likelihood of the initial bit using the inter-transmission-signal-point distance, the region number, and the inter-nearest-point distance.

15. The bit-likelihood calculating method according to claim 14, wherein the determining a region number includes determining a region number using a bisection method.

16. The bit-likelihood calculating method according to claim 14, wherein the calculating the inter-nearest-point distance includes selecting −1 or 1 from a value of a least significant bit (LSB) of the region number and setting a selection result as an inter-nearest-point distance of the initial bit.

17. The bit-likelihood calculating method according to claim 10, wherein
the calculating likelihood of the i-th bit further includes:
calculating a difference between an inter-nearest-point distance with respect to the (i−1)th bit and an inter-nearest-point distance with respect to the i-th bit; and
calculating likelihood of the i-th bit of the data from likelihood of the (i−1)th bit and the difference using the recurrence formula.

18. The bit-likelihood calculating method according to claim 17, wherein the calculating a difference in inter-nearest-point distance includes, when calculating a difference in likelihood calculation for the i-th bit. determining, from values with respect to region numbers of the i-th bit and the (i1)th bit, a shift amount, an addition value, and a sign bit corresponding to the values and calculating the difference in inter-nearest-point distance during the likelihood calculation for the i-th bit.

* * * * *